United States Patent [19]

Hutchison et al.

[11] 3,999,827

[45] Dec. 28, 1976

[54] ELECTRICAL CONNECTOR FOR SEMICONDUCTOR DEVICE PACKAGE

[75] Inventors: Robert V. Hutchison, Oceanside; John A. Nelson, San Diego; Gerald R. Dunn, Carlsbad, all of Calif.

[73] Assignee: Burroughs Corporation, Detroit, Mich.

[22] Filed: Oct. 10, 1975

[21] Appl. No.: 621,467

[52] U.S. Cl. .................... 339/17 CF; 339/75 MP; 339/275 B

[51] Int. Cl.² ................................. H05K 1/12

[58] Field of Search .......... 339/17 R, 17 C, 17 CF, 339/17 N, 17 L, 75 LM, 75 M, 75 MP, 176 MP, 192 R, 275 B

[56] References Cited

UNITED STATES PATENTS

| | | | |
|---|---|---|---|
| 3,660,803 | 5/1972 | Cooney | 339/176 MP |
| 3,696,323 | 10/1972 | Kinkaid et al. | 339/17 C |
| 3,831,131 | 8/1974 | Woodcock et al. | 339/17 CF |

*Primary Examiner*—W. Tupman
*Assistant Examiner*—Neil Abrams
*Attorney, Agent, or Firm*—G. Gregory Schivley; Mervyn L. Young; Kevin R. Peterson

[57] ABSTRACT

A unique contact pin configuration for an electrical connector provides an advantageous connection with a leadless semiconductor device package and a printed circuit board on which the connector is to be mounted. Each contact pin includes an elongated shaft portion, a resilient contact portion and a crossbar portion which offsets the contact portion from the shaft portion of the contact pin. Each contact pin is alternately situated 180° in cavities disposed on two opposed sides of the connector. Consequently, the contact portions of the contact pins provide internal electrical connection to a leadless semiconductor device package with a small contact pad spacing, while providing an external electrical connection via the contact pin shaft portions with a larger spacing therebetween. Also described herein are distinctive stand-off bumps which are coaxial with the shaft portions of the contact pins to insure level mounting onto a printed circuit board.

5 Claims, 5 Drawing Figures

ELECTRICAL CONNECTOR FOR SEMICONDUCTOR DEVICE PACKAGE

CROSS REFERENCE TO RELATED APPLICATIONS

United States patent applications Ser. No. 513,283, filed Oct. 9, 1974, entitled "Packaging System For Electronic Equipment", by Robert E. Braun et al now U.S. Pat. No. 3,946,276; U.S. Ser. No. 513,282, filed Oct. 9, 1974, entitled "Hold Down Device For Use In Systems Employing Integrated Circuits", by Peter T. Klein et al, now U.S. Pat. No. 3,942,854; and U.S. Ser. No. 513,278, filed Oct. 9, 1974, entitled "Integrated Circuit Package Connector With Probing Facility", by Robert E. Braun et al now U.S. Pat. No. 3,955,867, have the same assignee and relate to the same general subject matter as the present invention.

BACKGROUND OF THE INVENTION

This invention relates to electrical connectors. More particularly it relates to connectors adapted to receive a flat integrated circuit device package.

The high density packaging of electronic equipment, particularly data processing systems, may involve the installation of pluggable integrated circuit packages in receptacles or connectors. The connectors in turn are mounted on an interconnection medium, such as a printed circuit board. The electrical contact pins within the connector provide electrical circuit paths between the integrated circuit package contact pads and the conductor termination lands or conductor pads on the printed circuit board. Hold down means are often provided to apply a clamping force to the installed integrated circuit package to insure that a uniform electrical connection is made between the integrated circuit package and the connector. One such packaging system is described and claimed in the referenced U.S. pat. application Ser. No. 513,283, filed Oct. 9, 1974 by Robert E. Braun et al now U.S. Pat. No. 3,946,276, entitled "Packaging System For Electronic Equipment", which is also assigned to the same assignee as the present invention. The present invention involves an improved alternative to the connector as disclosed in the above patent application.

The leadless integrated circuit packages which are generally used in this or similar packaging systems often have a contact pad spacing of 0.05 inch or less between adjacent contact pads. The contact pins of the prior art connectors are all in the same vertical plane. Consequently, the circuit board on which the package is mounted had to also provide a correspondingly small conductor pad spacing in order to interface with the contact pins projecting from the lower surface of the connector. While such a circuit board arrangement has been made with satisfactory results, the yield in high volume production is expected to be somewhat low due to the extremely small spacing between adjacent contact pin receiving elements, or conductor pads, on the printed circuit board. One suggested method of obviating this predicament is to stagger the connector contact pins in a zig-zag pattern along each side of the connector. For example, see U.S. Pat. No. 3,846,737 Spaulding entitled "Electrical Connector Unit for Leadless Circuit Device" or U.S. Pat. No. 3,831,131 Woodcock et al entitled "Integrated Circuit Package Connectors". However, such a connector "pin-out" configuration does not lend itself to optimum circuit board manufacturing techniques. Computerized automatic routing equipment is often used by circuit board manufacturers to automatically print the design on the masks used to etch the conductors on the circuit board in the desired pattern. In order to accommodate the zig-zag connector pin-out configuration, many man hours must be consumed in order to program the automated routing equipment. But even more importantly is that valuable computer time is used to control the routing equipment. The staggered pin-out requires additional computer time to route the conductors around the non-uniformly spaced conductor pads. Moreover, the staggered conductor pad spacing limits the number of conductors that can be run through the conductor pad area on the board.

In the packaging system of Ser. No. 513,283, the connector must be mounted level with respect to the supporting printed circuit board. This planarity is required in order to insure that the package contact pads provide equal downward force on the connector contact pins after the package has been clamped against the cooling frame. An even distribution of pressure between the package contact pads and connector contact pins is essential for proper electrical connection. It is general practice to provide stand-off bumps to lift the bottom of the connector off of the surface of the printed circuit board. This is to facilitate cleaning of the printed circuit board after soldering (e.g. flux removal). However, the randomly placed stand-off bumps used on commercially available connectors do not provide satisfactory results when accurate planarity with the printed circuit board is required. For example, one of the stand-off bumps may directly abut the top surface of the printed circuit board, whereas another stand-off bump may abut a conductor on the printed circuit board. Accordingly, the connector may have a tendency to wobble and does not provide a suitable level reference for proper connection with the leadless package in the packaging system disclosed in U.S. Pat. No. 3,946,276.

OBJECT AND SUMMARY OF THE INVENTION

Therefore it is an object of this invention to provide an electrical connector which permits an internal electrical connection to a leadless integrated circuit device package with closely spaced contact pads, while at the same time providing external electrical connection to a printed circuit board in a configuration which complements printed circuit board manufacturing and design techniques.

It is a further object of this invention to provide an electrical connector with stand-off bumps which insure level reference with a supporting printed circuit board.

Briefly, these and other objects of this invention are accomplished by the use of a connector which includes an insulative body member having an upper surface for receiving the integrated circuit device package. The body member has a plurality of cavities in the upper surface thereof which are disposed in two opposed rows which generally correspond with the contact pads on the integrated device circuit package. A uniquely designed electrically conductive contact pin is located in each of the cavities. Each contact pin includes an elongated shaft portion which provides external electrical connection with wrapped wire conductors, a resilient contact portion for making electrical connection to the contact pads on the integrated device circuit package, and a crossbar portion which offsets the contact portion from the shaft portion. The contact pins are arranged in the cavities so that they are alternately situated 180° from the contact pins in adjacent cavities. Consequently, the contact portion of the contact pins provide electrical connection to the package contact pads having a small spacing therebetween, while at the same time providing external electrical connection, for example, to a printed circuit board, with a larger spacing therebetween. The shaft portions protrude from the lower surface of the connector in a rectangular grid pattern along each side of the connector. This rectangular grid pattern complements the automated routing equipment used to provide the conductors on the printed circuit board. Consequently, valuable computer time is minimized and the number of conductors per board can be increased. Stand-off bumps are also provided to insure level mounting of the connector onto the printed circuit board. The stand-off bumps are coaxial with a selected number of contact pin shaft portions. Consequently, they will always abut the top surface of a conductor on the printed circuit board. The stand-off bumps also include grooves on the bottom surfaces thereof to facilitate soldering the shaft portions into corresponding holes in a printed circuit board.

DESCRIPTION OF THE PREFERRED EMBODIMENT

Figure 1:
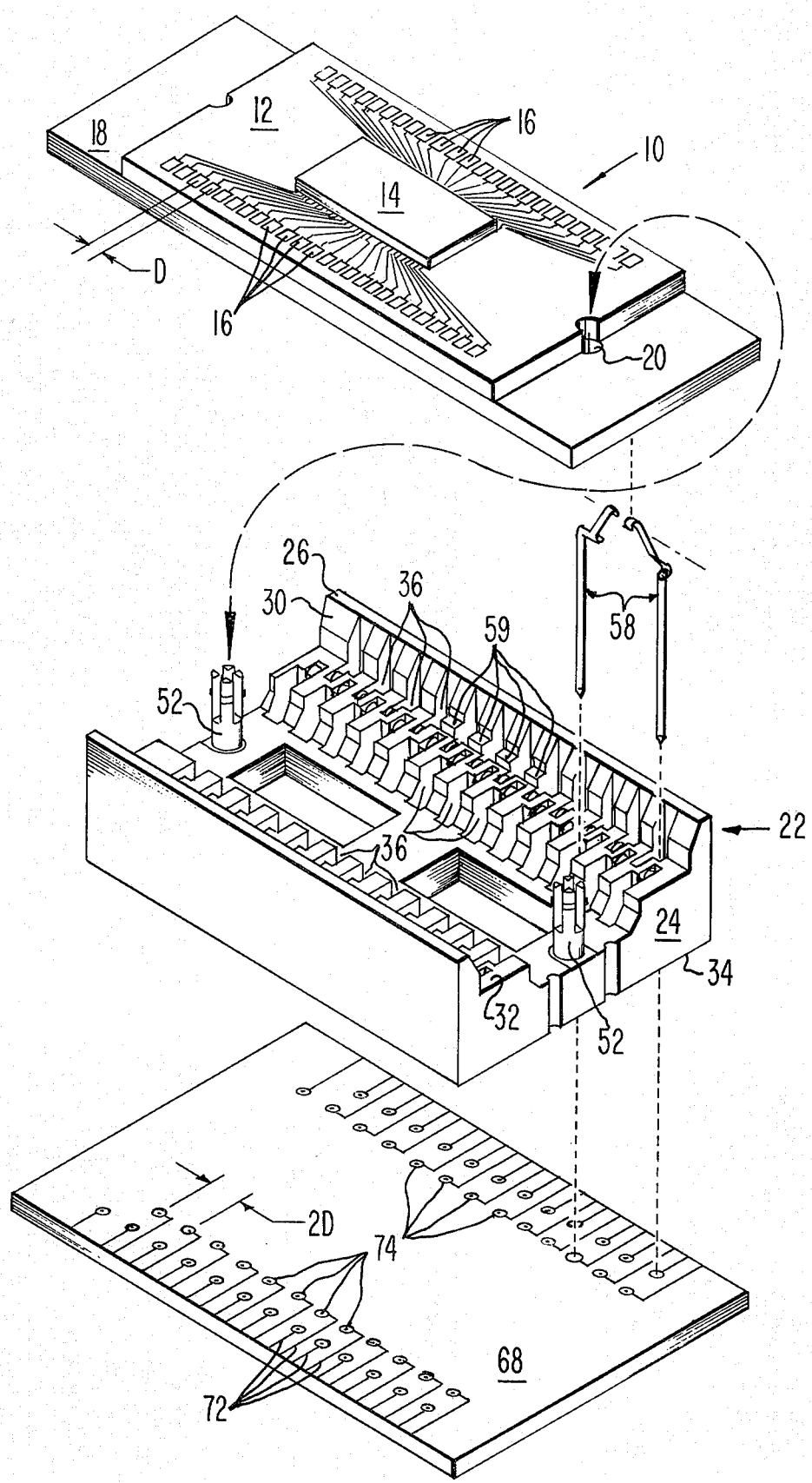
FIG. 1 is an exploded perspective view showing one embodiment of the connector of this invention, a leadless integrated circuit package, and a printed circuit board.

Referring now to drawings, especially FIG. 1, there is shown a flat or planar integrated circuit device package 10 which may be used with the connector of this invention. This so called "leadless" package 10 may utilize a ceramic body 12 having a semiconductor chip (not shown) hermetically sealed in a cavity formed therein. A lid 14 covers the chip in the cavity. A plurality of conductors on the package provide electrical connection to the chip and radially extend outwardly and terminate in the shape of enlarged contact pads 16. Contact pads 16 are arranged in a predetermined pattern along two opposed sides of the upper or connection surface of ceramic body 12. Typically, the contact pads have a spacing between center to center, of about 0.050 inches. For ease in describing this embodiment the spacing between the contact pads will be referred to as D. The lower surface of the ceramic body 12 is fused to a heat sink member 18. Heat sink member 18 extends longitudinally from ceramic body 12 to provide integral extensions at its opposite extremes which are adapted to be clamped against the cooling frame of the referenced patent application Ser. No. 513,283. Heat sink member 18 includes two openings 20 on its extension portions which correspond with alignment posts on the connector. It should be realized that the description of the integrated circuit device package 10 is for illustrative purposes only and should not be construed in a limiting nature since a variety of flat leadless packages as known in the art can be used in the connector of this invention.

Special attention should now be drawn to the connector of this invention which is generally designated by the numeral 22. The connector includes a molded body 24 of insulative material such as plastic. Body member 24 has two parallel upright side walls 26 and 28 which extend longitudinally along the major sides of body member 24. Each side wall 26 and 28 includes an inwardly sloping portion 30 which aids in the insertion of the package 10. An upper surface 32 for body member 24 is adapted to receive the connection surface of package 10. Body member 24 also includes a flat lower surface 34 which is mutually parallel with upper surface 32.

Figure 2:
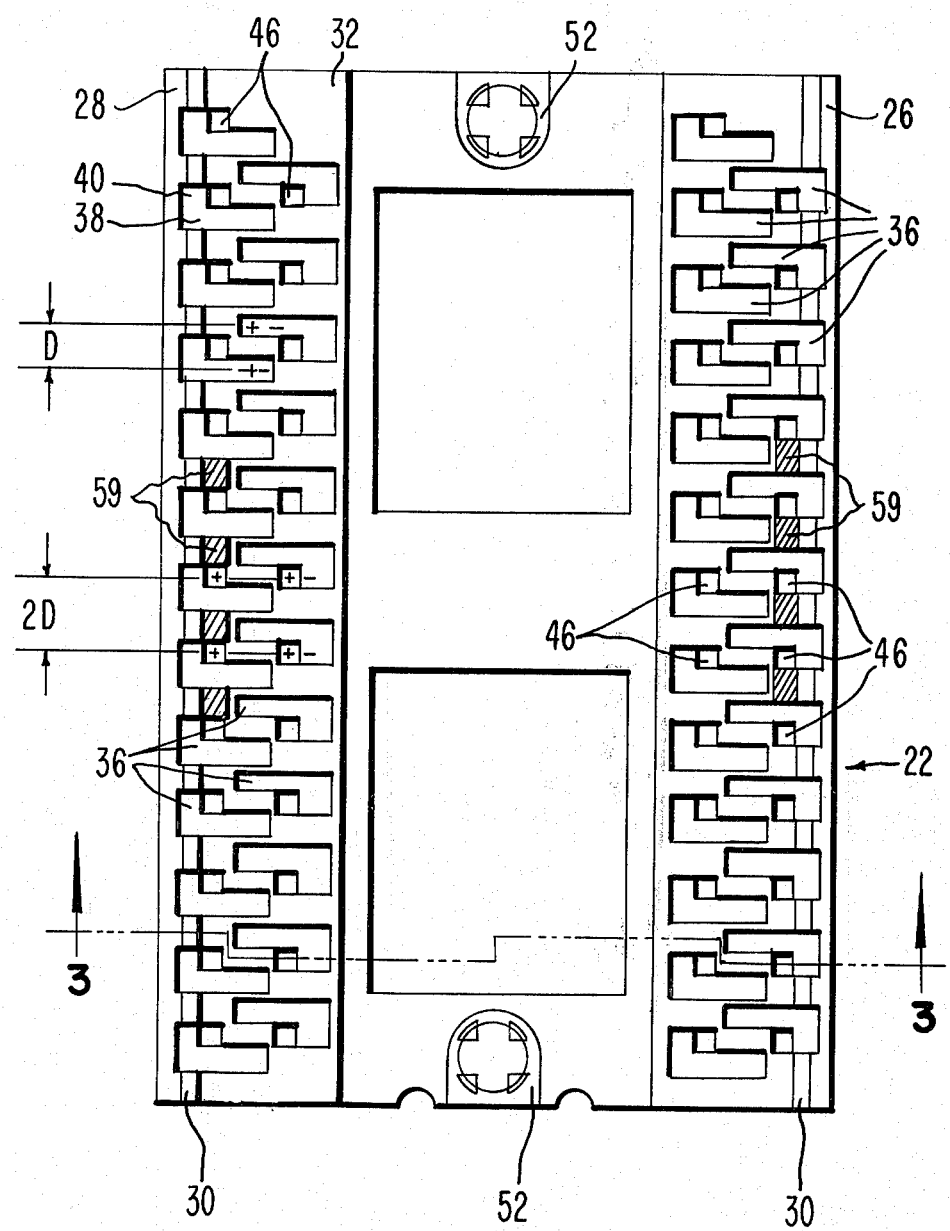
FIG. 2 shows a top plan view of the connector shown in FIG. 1.

As can be seen most clearly in FIG. 2, a plurality of cavities 36 are disposed in upper surface 32 in two opposed rows which generally correspond with the contact pads 16 of package 10. For ease of description of this invention a row will be designated as an imaginary line which runs parallel with the side walls 26 and 28 of connector 22, while a column will be taken to mean an imaginary line which runs perpendicularly to side walls 26 and 28. Furthermore, the directional terms such as upper, lower and the like which are referred to throughout this specification and in the appended claims are in reference to the particular position of the connector 22 as shown in the drawings. It should be understood, however, that this terminology is employed only for the convenience in description. Connector 22 can be mounted in virtually any desired orientation, even upside down, if necessary.

As can be seen most clearly in FIG. 2, cavities 36 are generally L-shaped each having a foot portion 40 and a leg portion 38 defining the "L". The leg portion 38 is the elongated segment of the cavity 36 which lies in the horizontal plane shown in FIG. 2. The foot portion is the protrusion from the leg portion 38 which lies in the vertical plane shown in FIG. 2. The cavities 36 are arranged in each row so that they are alternately situated 180° about an axis defined by the row in which the cavities are located. In other words, each successive cavity has been rotated 180° from its next adjacent cavity so that leg portions of successive cavities alternately face toward different side walls of the body member 24. The leg portions 38 of the cavities thus form an interdigitated arrangement with the spacing between the centers of each leg portion 38 being equivalent to the distance between the centers of the contact pads 16 of package 10. In this preferred embodiment the spacing is about 0.05 inches and is designated as D in FIG. 2.

Figure 3:
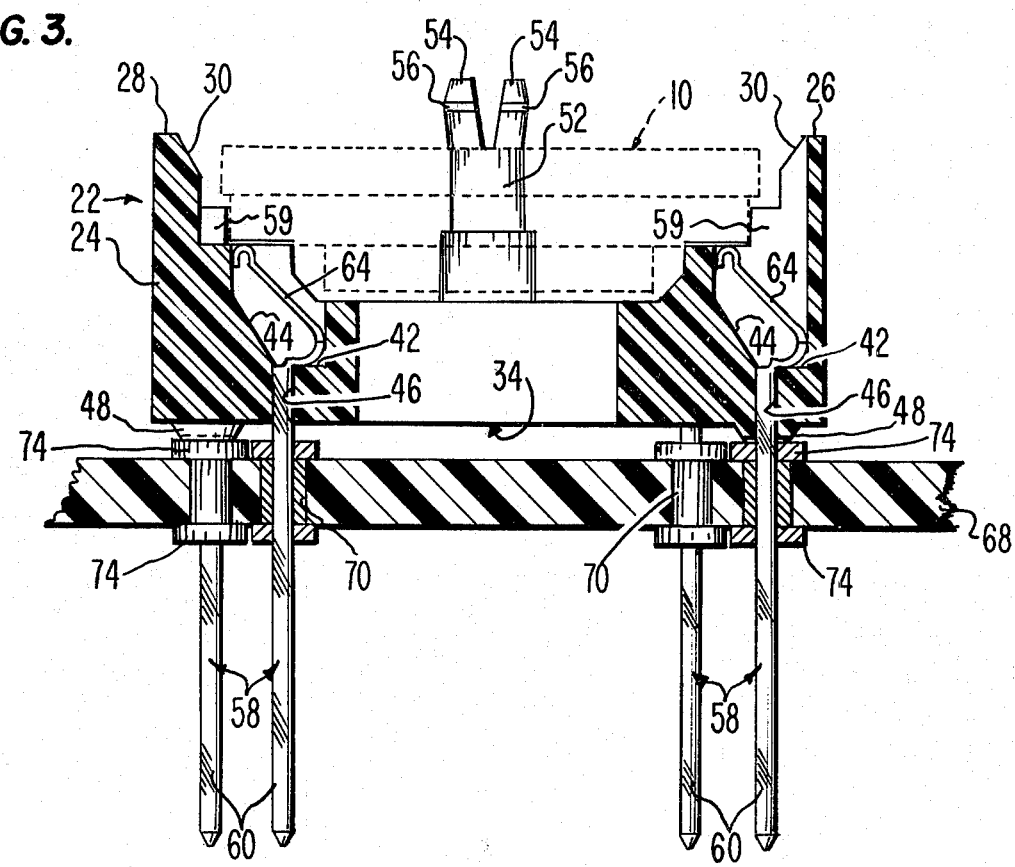
FIG. 3 shows a sectional view of the connector mounted on a printed circuit board along the lines 3—3 of FIG. 2.

Each cavity has a generally flat bottom surface 42 which is mutually planar with upper surface 32 and lower surface 34, as can be seen in FIG. 3. Inclined side portions 44 for each cavity 42 insures proper orientation of the contact pins as will become clear later in the description of this embodiment. Each cavity 36 includes a rectangular opening 46 extending from bottom surface 42 to lower surface 34. Referring again to FIG. 2, openings 46 are disposed in the foot portion 40 of each cavity 38. The openings 46 in each row of cavities 36 define a grid pattern having two rows mutually parallel with the axis defined by each row of cavities. The foot portions of successive cavities overlap in such manner that the openings 46 are also arranged in columns with two openings in each column of each row of cavities. This is true except for the last cavity in the lower portion of each row of cavities. The spacing between each column of openings 46 is 0.10 inch in this embodiment and is designated in the drawings as 2D.

Figure 5:
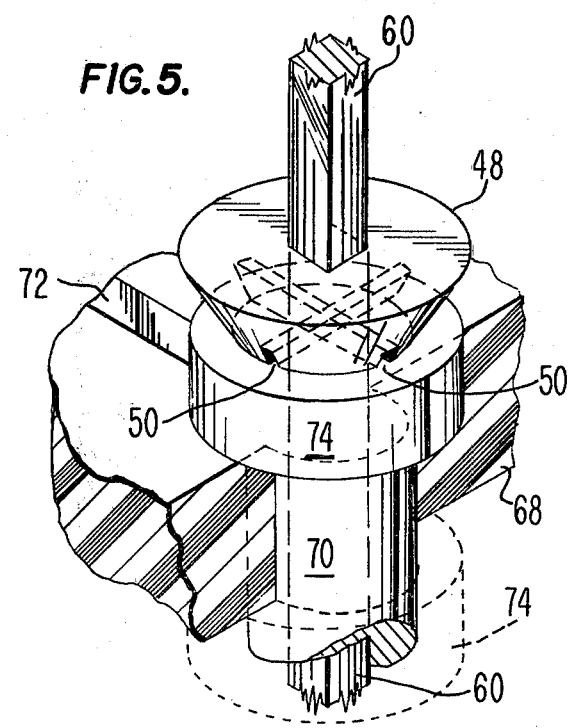
FIG. 5 shows an enlarged partial sectional view which illustrates the abutment of a stand-off bump of the connector with a conductor on the printed circuit board.

Referring now to FIGS. 3 and 5, special stand-off bumps 48 are provided on the lower surface 34 of body member 24. There are three equally spaced stand-off bumps on each side of the connector member 24. Stand-off bumps 48 are integral parts of connector member 24 and are coaxial with openings 46 in each of their respective cavities. That is, opening 46 extends through the center of each of the stand-off bumps 48. The stand-off bumps are in the shape of a truncated cone and have an outer flat surface which is smaller than the corresponding pad on the printed circuit board which it will abut when the connector is mounted thereon. As it can be seen most clearly in FIG. 5, each stand-off bump 48 includes grooves 50 in an X-shaped configuration on its outer surface which extends through opening 46 therein. Grooves 50 are approximately 0.10 inch deep in this embodiment and provide air passageways which facilitates soldering the connector 22 to the circuit board as will become more clear hereinafter.

Two alignment posts 52 on opposite ends of the connector 22 provide a locating mechanism which cooperates with openings 20 in the package 10 to align the contact pads 16 with their appropriate contacting pins in the connector 22. Each post 52 includes four upwardly extending tynes 54 each including a radially projecting ridge 56 thereon. The tynes 54 are flexible inasmuch as they yield to a manual compressive force so that the posts 52 can be inserted into the openings 20 of package 10 to accomplish alignment and to restrain the package 10 with ridge 56 from disengaging the connector 22 after alignment. Two locating ledges 59, one each at the junctions of the upper surface 32 and each side wall of body member 24 aid in insuring that the package 10 will fit snugly into the connector 22. Ledges 59 prevent the package 10 from rotating after engagement with the connector 22 thereby preventing misalignment of the package contact pads 16 with their respective connector contact pins.

Figure 4:
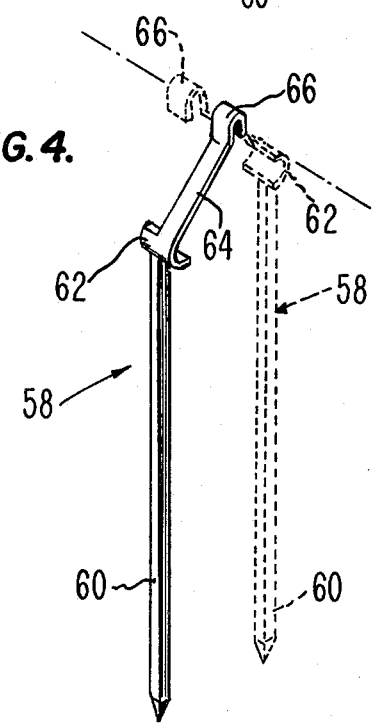
FIG. 4 shows a perspective view of a contact pin of the connector shown in FIG. 3.

Special attention is now drawn to the connector contact pin which is shown most clearly in FIG. 4. Each contact pin 58 is preferably formed of dual gauge copper alloy such as CA 170 or 172, and serves the dual function of providing a wire wrap tail contact at its lower extremities and which further provides electrical contact to the contact pads 16 of package 10 at its upper extremities. Each contact pin 58 includes three distinct portions: a shaft portion 60, a crossbar portion 62, and a contact portion 64. Shaft portion 60 is an elongated rod having a 0.025 inch square cross-section which provides a tail around which wire leads may be wrapped. Contact portions 64 is generally C-shaped and provides a resilient member which provides electrical connection to the contact pads 16 of package 10. The U-shaped tip 66 provides a wiping action on the contact pads 16 to insure excellent electrical connection. To further enhance such connection, tip 66 can be plated or inlaid with a noble metal such as gold (not shown). Shaft portion 60 and contact portion 64 lie in the same plane. However, they are offset a distance of 0.025 inch by crossbar portions 62. Crossbar portion 62 lies in a plane transverse to the planes in which shaft portion 60 and contact portion 64 lie. Accordingly, the contact pin 58 provides a unitary design in which crossbar portion 62 connects the upper end of shaft portion 60 to the lower end of contact portion 66.

Reference to FIG. 3 will better illustrate how contact pin 58 is inserted into body member 22. The shaft portion 60 provides an interference fit with the walls of opening 46. Shaft portion 60 may include small projections (not shown) its outer surfaces to dig into the side walls of the openings to provide controlled pull-in and push-out forces. It should be noted that the contact pins 58 can be manually inserted into their respective cavities 36. They can also be removed merely by exerting an upward force on the contact pins to remove them if necessary, for example, for replacement purposes. The shaft portion 60 is disposed in its respective cavity opening 46 and extends from the lower surface 34 of body member 22. The contact pin crossbar portion 62 lays on the bottom surface 42 of the cavity and extends from opening 46 to the junction between foot portion 40 and leg portion 38 of the cavity. The contact portion 64 is generally confined by the leg portion 38 of the cavity and projects slightly above the upper surface 32 of body member 22 when not engaging package 10. Just as cavities 36, the contact pins 38 are alternately situated 180° from the contact pins in adjacent cavities. As it can be seen most clearly in FIG. 1, all of the contact pins 58 in each row of cavities project from upper surface 32 in a straight line defined by the tips 66 which correspond with the contact pads 16 of package 10. The spacing between adjacent tips 66 is equivalent to the spacing between the contact pads 16 of package 10.

The connector 22 can be mounted on an interconnecting medium such as a printed circuit board 68. Printed circuit board 68 includes a plurality of plated through holes 70 which correspond to the shaft portions 60 of the contact pins 58. Conductors 72 on both surfaces of the circuit board terminate over holes 70 in the form of enlarged pads 74. The connector 22 can be mounted on printed circuit board 68 by soldering the contact pin shaft portions 60 into their respective plated through holes 70. One common method of providing this soldering operation is to insert the shaft portions 60 into the plated through holes and then pass the lower surface of the circuit board 68 over a wave soldering mechanism. The solder then wicks up through the plated through holes to insure proper electrical connection. The grooves 50 in the stand-off bumps 48 insure that proper wicking action takes place. If the grooves were not present, the stand-off bumps 48 would effectively seal off the holes 70 and thereby inhibit proper wicking action during the soldering process. However, grooves 50 provide an air passage up through the holes 70 and out into the atmospheric air. Consequently, proper wicking action is enhanced thereby.

By placing the stand-off bumps 48 coaxial with shaft portions 60, it is insured that all stand-off bumps 48 will be abutting a level reference, here, the top of the printed circuit board pads 74. If the stand-off bumps 48 were not coaxial with shaft portions 60, one bump 48 may abut a printed circuit board pad 74 or conductor 72 whereas another stand-off bump 48 may abut the top surface of printed circuit board 68. Since the conductors 72 and pads 74 have a thickness of approximately three mils, wobbling of the connector 22 may occur if all stand-off bumps are not terminated on the same plane. Consequently, the unique placement of the stand-off bumps of this invention eliminates this possibility since stand-off bumps 48 will always abut a pad 74 on the printed circuit board 68.

Another aspect of this invention now can be readily appreciated. The connector 22 provides internal electrical connection to package 10 with a contact pad 16 spacing of 0.05 inches in this embodiment. However, the shaft portions have a pin-out configuration in a rectangular grid pattern with a spacing between adjacent shafts of 0.10 inch. Consequently, the corresponding pads 74 and holes 70 on the printed circuit board need only be spaced together a distance of 0.10 inch. Furthermore, the pads are in a rectangular grid pattern and not in a zig-zag or staggered pattern. Consequently, the automatic routing equipment which provides the conductor 72 pattern on the printed circuit board 68 can quickly perform this operation without using an excess of computer time. Furthermore, if it were not for the rectangular grid pin-out pattern of the connector pins 58, more complex programming of the automatic routing equipment must be undertaken. Another advantage of the rectangular grid pin-out configuration is that more conductors can be readily placed between the pads 74 than if they were in a staggered pattern. It should also be realized that all of these advantages can be accomplished with only one standard connector pin design. Accordingly, it is not necessary that two different contact pin designs be used in order to achieve the advantageous connector to package and connector to printed circuit board connections as embodied in this invention. Therefore, expenditures for tooling is minimized since the same contact pin can be used throughout the connector.

After the connector 22 has been mounted on the printed circuit board 68, the package 10 can be inserted into the connector 22. The tynes 54 of alignment posts 52 are manually pressed together so that they can be inserted into the openings 20 of package 10. In such a manner, alignment of the package contact pads 16 and the contact portions 64 of the connector contact pins is automatically accomplished. After insertion, the tynes 56 expand to hold the package 10 in place even if the circuit board is turned upside down. By using a relatively large plurality of tynes 54, here, four in number, instead of a unitary post or only two tynes, increased resiliency is obtained while the possibility of breakage during repeated use is reduced.

It should be understood that while this invention has been described in connection with a particular example thereof, no limitation is intended thereby except as defined in the appended claims.

What is claimed is:

1. An electrical connector for supporting and completing electrical connection to a planar integrated circuit device package having a plurality of electrically conductive pads arranged in a predetermined pattern along at least two opposed sides of a substantially planar connection surface, said connector comprising:
    an insulative body member having at least two parallel upright side walls, a lower surface, and an upper surface for receiving the connection surface of the integrated circuit package;
    said body member having a plurality of spaced cavities in said upper surface disposed in two opposed rows generally corresponding with the contact pads on the integrated circuit device package, each cavity having a bottom surface between said upper and lower surfaces of said body member, and having an opening therein extending from the cavity bottom surface to the lower surface of the body member;
    a plurality of identical electrically conductive contact pins, one each being located in each of said cavities; each contact pin having an elongated shaft portion having a major longitudinal axis, a resilient contact portion having a generally C-shaped configuration with a mating region for engaging a package contact pad, and a crossbar portion connecting one end of the shaft portion with one end of the contact portion, said crossbar portion being transverse to the longitudinal axis of the shaft and offsetting said contact portion in a plane orthogonal to a plane defined by the shaft and crossbar portions;
    said contact pins being arranged in the cavities so that each identical pin is alternately situated 180° about an axis defined by each row of cavities, said shaft portion of each contact pin being disposed in its respective cavity opening and extending from the lower surface of the body member, the part of the shaft extending from the body member being adapted to facilitate insertion into holes in a printed circuit board, said crossbar portion of each contact pin being disposed on its respective cavity bottom surface and extending parallel to said body member side walls, said crossbar portions of adjacent contact pins being oppositely directed to bring their respective contact portions into an interdigitated arrangement projecting towards the upper surface of the body member with the mating regions being disposed in two rows corresponding to the two rows of contact pads on the integrated circuit device package, with the mating regions between adjacent contact pins being spaced together a distance less than the distance between the shaft portions of the same adjacent pins;
    whereby said connector provides internal electrical connection via said contact portion mating regions of said contact pins to an integrated circuit device package with a pad spacing of D, while providing external electrical connection via said shaft portions of the contact pins to a printed circuit board with a spacing of greater than D between adjacent shaft portions.

2. An electrical connector for supporting and completing electrical connection to a planar integrated circuit device package having a plurality of electrically conductive pads arranged in a predetermined pattern along at least two opposed sides of a substantially planar connection surface, said connector comprising:
    an insulative body member having at least two parallel upright side walls, a lower surface, and an upper surface for receiving the connection surface of the integrated circuit package;
    said body member having a plurality of spaced cavities in said upper surface disposed in two opposed rows generally corresponding with the contact pads on the integrated circuit device package, said cavities each being generally L-shaped with a leg and foot portion, said cavities being arranged in each row so that each cavity is alternately situated 180° about an axis defined by each row of cavities, with leg portions of successive cavities alternately facing toward different side walls and having a spacing of D between the leg portions of adjacent cavities, each cavity having a bottom surface between said upper and lower surfaces of said body member, an opening in each cavity disposed in the foot portion thereof, said opening extending from the cavity bottom surface to the lower surface of the body member, the openings in the cavities in each row defining a grid pattern having two rows mutually parallel with the axis defined by the row of cavities and having a plurality of columns with two openings in substantially each column, the spacing between each column being greater than D;

an electrically conductive contact pin located in each of said cavities, each contact pin having an elongated shaft portion having a major longitudinal axis, a resilient contact portion having generally C-shaped configuration and being situated about a longitudinal axis parallel to that of said shaft portion, and a crossbar portion connecting one end of the shaft portion with one end of the contact portion, said crossbar portion being transverse to the longitudinal axis of the shaft to thereby offset said contact portion from said shaft portion;

said contact pin shaft portion being disposed in said cavity opening and extending from the lower surface of the body member to provide a wire wrap connection, said contact pin crossbar portion being disposed on said cavity bottom surface, and said contact pin contact portion being disposed in the leg portion of the cavity and projecting above the upper surface of the body member to provide electrical connection for the pads on the integrated circuit device package; and whereby said connector provides internal electrical connection via said contact portions of said contact pins to an integrated circuit device package with a pad spacing of D, while providing external electrical connection via said shaft portions of the contact pins to an interconnection medium in the configuration of a rectangular grid pattern with a spacing of greater than D between adjacent columns of said shaft portions.

3. The electrical connector of claim 2 which further comprises a plurality of stand-off bumps on the lower surface of the body member, said stand-off bumps having an aperture coaxial with the openings in said cavities, with the shaft portions of the contact pins extending therethrough.

4. The connector of claim 3 wherein said stand-off bumps are in the shape of an inverted truncated cone with a flat outer major surface, said major surface having at least one groove therein extending from the aperture to the periphery thereof to facilitate soldering the shaft portions of the contact pins to corresponding holes in a printed circuit board.

5. The connector assembly of claim 4 which further comprises two upright alignment members projecting from the upper surface of the body member, said alignment member having four upwardly extending tynes which yield to a manual compressive force whereby an integrated circuit package having a corresponding opening may be inserted therein to align contact pads thereon with their corresponding contact portions of the contact pins of the connector.

* * * * *